US012787272B2

(12) United States Patent
Sel et al.

(10) Patent No.: US 12,787,272 B2
(45) Date of Patent: Nov. 3, 2026

(54) METHOD FOR PILLAR BENDING IMPROVEMENT BY CUT TIERS PATTERN IMPLEMENTATION

(71) Applicant: Intel NDTM US LLC, Santa Clara, CA (US)

(72) Inventors: Jong Sun Sel, Dalian (CN); Yao Xing, Dalian (CN); Long Chen, Dalian (CN); Hoon Koh, San Jose, CA (US); Wenwu Zhu, Dalian (CN); Anil Chandolu, Boise, ID (US)

(73) Assignee: Intel NDTM US LLC, Santa Clara, CA (US)

( * ) Notice: Subject to any disclaimer, the term of this patent is extended or adjusted under 35 U.S.C. 154(b) by 411 days.

(21) Appl. No.: 18/215,595

(22) Filed: Jun. 28, 2023

(65) Prior Publication Data

US 2023/0345715 A1 Oct. 26, 2023

(30) Foreign Application Priority Data

Jun. 1, 2023 (WO) ................ PCT/CN2023/097720

(51) Int. Cl.
*H10B 41/10* (2023.01)
*H10B 41/27* (2023.01)
(Continued)

(52) U.S. Cl.
CPC ............. *H10B 41/10* (2023.02); *H10B 41/27* (2023.02); *H10B 43/10* (2023.02); *H10B 43/27* (2023.02)

(58) Field of Classification Search
CPC ........ H10B 41/10; H10B 41/27; H10B 43/10; H10B 43/27; H10B 41/50; H10B 43/50
See application file for complete search history.

(56) References Cited

U.S. PATENT DOCUMENTS

2010/0133599 A1* 6/2010 Chae ...................... H10B 43/50 257/315
2019/0287998 A1* 9/2019 Harada ................ H10D 62/115
(Continued)

OTHER PUBLICATIONS

Liu Shijun, et al., "Analysis of 3D Nand Technologies and Comparison Between Charge-Trap-Based and Floating-Gate-Based Flash Devices," The Journal of China Universities of Posts and Telecommunications, vol. 24, Issue 3, 2017, pp. 75-82. (Year: 2017).*

*Primary Examiner* — Davienne N Monbleau
*Assistant Examiner* — John Patrick Cornely
(74) *Attorney, Agent, or Firm* — Morgan, Lewis & Bockius LLP

(57) ABSTRACT

Methods and apparatus for pillar bending improvement by cut tiers pattern implementation. The method uses a cut tier pattern in a staircase region of a 3D memory structure to reduce pillar bending in a pillar array region. The pillar array region includes a plurality of memory tiers comprising wordline layers interposed between isolation layers, where a memory tier comprises a two-dimensional (2D) array of memory cells. A plurality of vertical structures comprising pillars pass through memory cells in the wordline layers and pass through the isolation layers. The staircase structure is disposed adjacent to the pillar array region and includes vertical wordline drivers coupled to the wordline layers. A cut tier pattern comprising vertical trenches is formed in the staircase structure toward a side of the staircase structure adjacent to the pillar array region. The cut tier pattern includes one or more breaks used for routing circuitry in the wordlines.

20 Claims, 15 Drawing Sheets

(51) Int. Cl.
*H10B 43/10* (2023.01)
*H10B 43/27* (2023.01)

(56) References Cited

U.S. PATENT DOCUMENTS

| | | | | |
|---|---|---|---|---|
| 2021/0335802 | A1* | 10/2021 | Lee | H01L 21/76877 |
| 2023/0067270 | A1* | 3/2023 | Kumar | H10B 43/27 |

* cited by examiner

METHOD FOR PILLAR BENDING IMPROVEMENT BY CUT TIERS PATTERN IMPLEMENTATION

CLAIM OF PRIORITY

The present application claims the benefit of priority to Patent Cooperation Treaty (PCT) Application No. PCT/CN2023/097720 filed Jun. 1, 2023, the entire content of which is incorporated herein by reference.

BACKGROUND INFORMATION

Three-dimensional (3D) NAND (not AND) technologies are commonly used to create nonvolatile (NV) storage devices, such as solid-state drives (SSDs). Reference to 3D NAND can more specifically refer to NAND flash. Unlike convention 2D memory devices, 3D NAND memory devices have one or more decks comprising tiers of circuit elements that are stacked on top of one another. The circuit elements are connected via channels in vertical structures (pillars) having high depth-to-width aspect ratios (AR).

Fabricating 3D memory devices having high AR pillars poses significant challenges. For example, tier expansion (i.e., increasing the height of tiers in a deck) results in higher pillar bending for the boundary pillars and causes yield lost due to upper deck to lower deck pillar misalignment, under punch, punch damage and bitline-to-bitline short.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Figure 1:
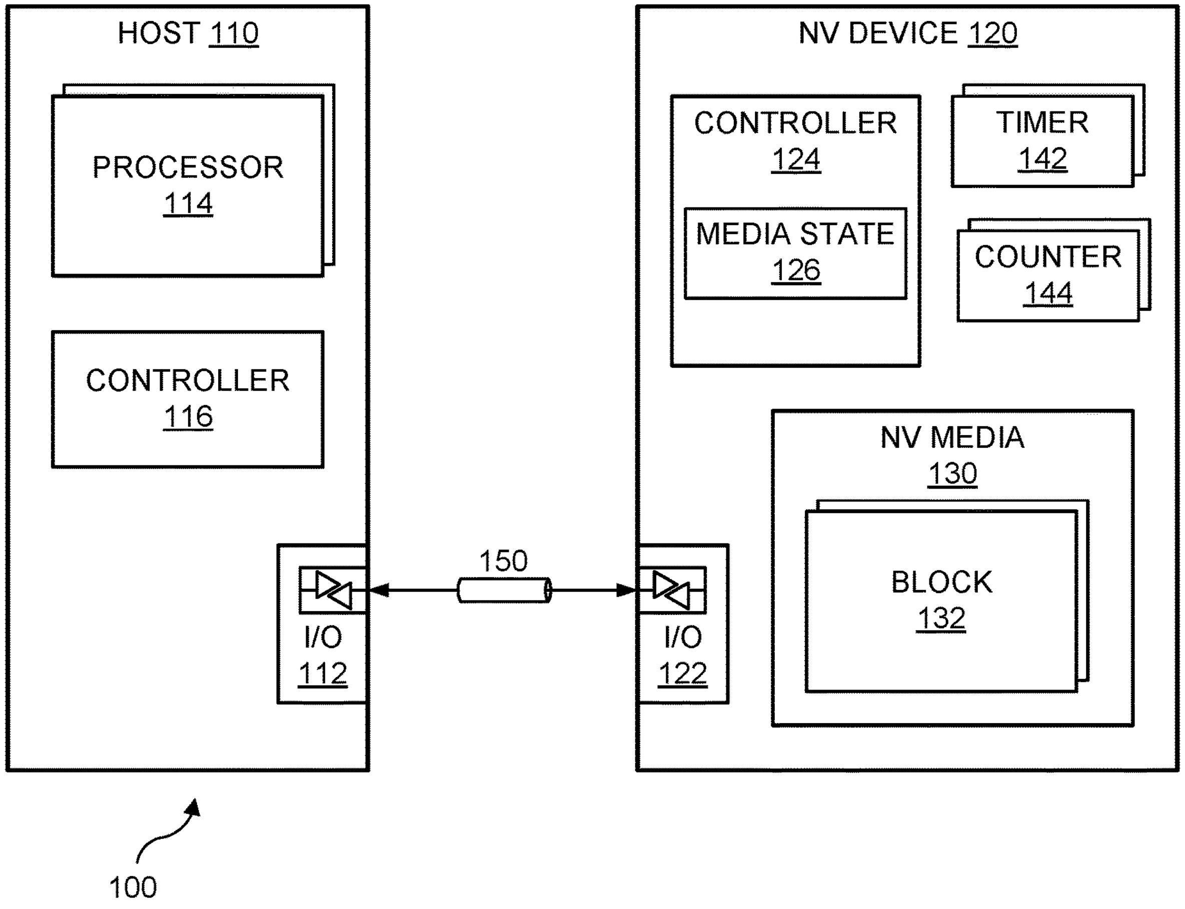
FIG. 1 is a block diagram of an example of a system that stores data in Non-volatile (NV) media.

Embodiments of methods and apparatus for pillar bending improvement by cut tiers pattern implementation are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

FIG. 1 is a block diagram of an example of a system that stores data in Non-volatile (NV) media. System 100 includes host 110 coupled to NV device 120. Host 110 represents a computing device. Host 110 includes I/O (input/output) 112, which represents hardware to interconnect with NV device 120. NV device 120 includes I/O 122 which corresponds to I/O 112. I/O 122 represents hardware to interconnect with host 110.

Host 110 provides a hardware platform to operate NV device 120. Host 110 includes one or more processors 114 to perform the operations of host 110. Processor 114 executes a host operating system (OS) that provides a software platform for the operation of NV device 120. The hardware platform provides hardware resources to interface with NV device 120 including transceiver hardware to perform access to the device. The software platform includes control software to execute other software elements such as applications or other agents that execute under the OS and create requests to access NV device 120.

I/O 112 and I/O 122 interconnect through one or more signal lines 150. Signal lines 150 typically include multiple separate lines and can be considered one or more buses to connect host 110 to NV device 120. Host 110 can send a host read command over signal line 150 to NV device 120. In response to the read command, NV device 120 services the request out of a transient Vt state, in accordance with any example provided.

In one example, host 110 includes controller 116. Controller 116 represents a memory controller or storage controller. In one example, controller 116 is integrated with processor 114. In one example, controller 116 is separate from processor 114. Controller 116 enables host 110 to manage access to NV device 120. In response to host operations by processor 114 that request access to data on NV device 120, controller 116 provides access to NV device 120. Controller 116 can represent hardware and firmware elements of host 110 to enable interaction with NV device 120.

NV device 120 includes controller 124, which represents a storage controller at the side of the storage device, which is separate from controller 116 of host 110. Controller 116 of host 110 represents components of the host system. Controller 124 represents components of the storage device or memory device into which the NV media is incorporated. Controller 124 receives commands sent from host 110 and determines how to service the command or request from the host. Controller 124 performs operations to access (e.g., read or write) NV media 130 in response to the host command.

NV media 130 represents a nonvolatile storage media of NV device 120. In one example, NV media 130 includes three-dimensional (3D) NAND (not AND) memory cells. In one example, NV media 130 includes 3D NOR memory cells. In one example, NV media 130 includes 3D crosspoint (XPOINT™) memory cells.

NV media 130 includes bitcells or memory cells organized as blocks 132. A block of memory refers to a portion of NV media 130 that is jointly charged or activated for an access operation. In one example, blocks 132 are subdivided as subblocks. In one example, a block refers to bitcells that share a select gate line. In one example, multiple subblocks share a select gate (e.g., a common select gate source (SGS) or a common select gate drain (SGD)) connector.

In one example, a block refers to an erase unit, or a unit size of NV media 130 that is erased together and monitored by controller 124 for number of writes. In one example, NV media 130 includes single level cell (SLC) and multilevel cell (MLC) media. For example, NV media 130 can include SLC and QLC (quad level cell) or SLC and TLC (triple level cell) bitcells. The block size could be different depending on the media type.

In one example, controller 124 is an ASIC (application specific integrated circuit) that controls operation of NV device 120. In one example, controller 124 is a CPU (central processing unit) core or processor device on NV device 120. In one example, NV device 120 represents an SSD and controller 124 controls multiple NV media dies or NV media chips integrated into the SSD. In one example, NV device 120 represents a module or PCB (printed circuit board) that includes multiple NV media dies or NV media chips integrated onto it and controller 124 controls the NV media dies of the module. In one example, controller 124 executes firmware to manage NV device 120. In one example, controller 124 executes firmware to manage NV device 120, including firmware to control the servicing of a read command based on whether the NV media is in thermal equilibrium.

In one example, controller 124 manages Vt state detection and read command servicing based on idle time or delay between consecutive read commands. In one example, controller 124 monitors one or more media states 126. Media state 126 represents a state of a portion of memory (such as a block) and can determine how to access the media based on media state 126. For example, if media state 126 indicates that a target block is in a stable state, controller 124 can first issue a dummy read prior to accessing the target block. In one example NV media devices 120 may include one or more timers 142 and counters 144.

Figure 2:
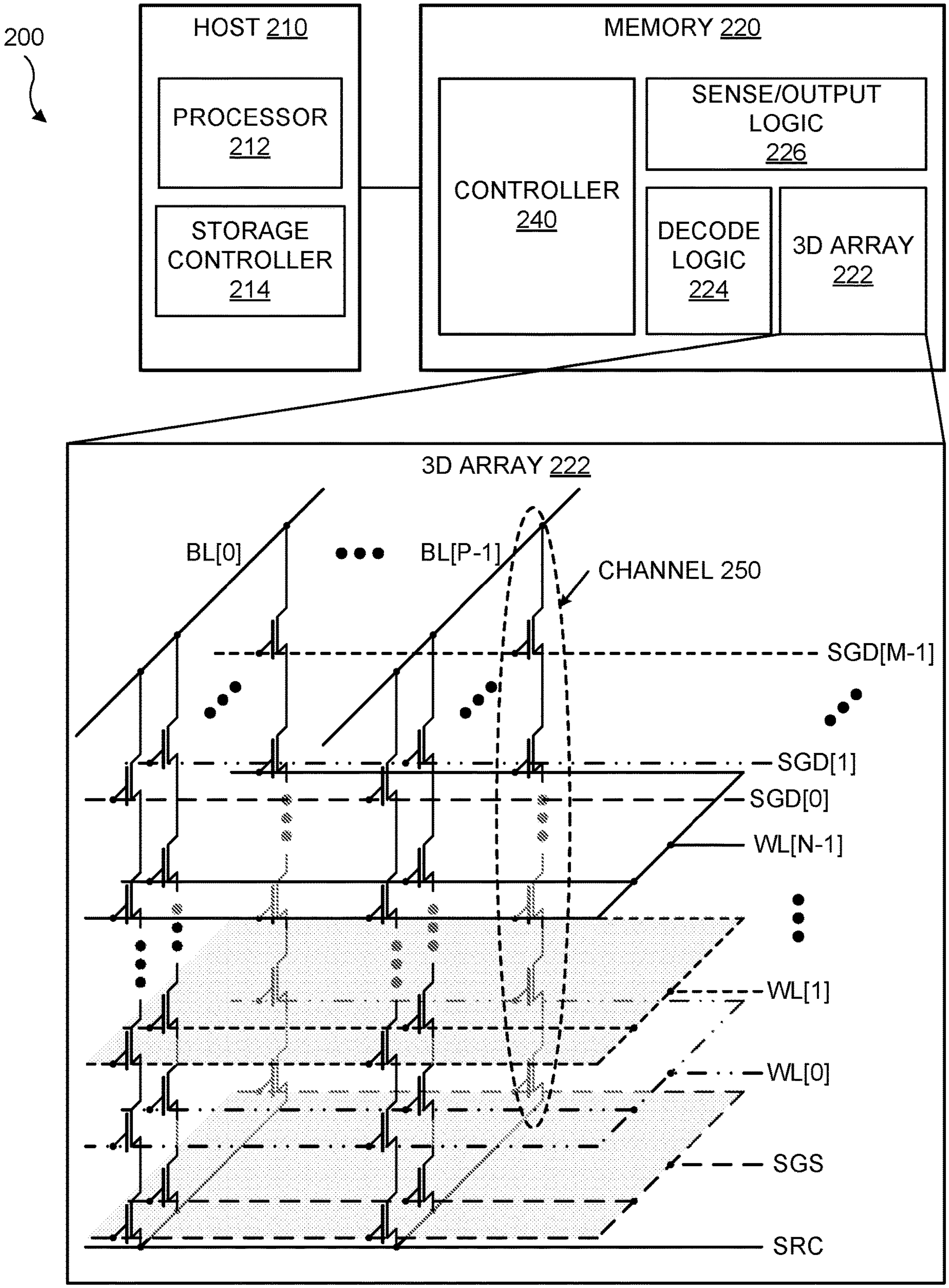
FIG. 2 is a block diagram of an example of system including a three-dimensional (3D) memory device structure.

FIG. 2 is a block diagram of an example system illustrating further details of a 3D memory device structure. System 200 represents a computing device that includes a 3D memory. Host 210 represents a hardware platform that performs operations to control the functions of system 200. Host 210 includes processor 212, which is a host processor that executes the operations of the host. In one example, processor 212 is a single-core processor. In one example, processor 212 is a multicore processor device. Processor 212 can be a general-purpose processor that executes a host operating system or a software platform for system 200. In one example, processor 212 is an application specific processor, a graphics processor, a peripheral processor, or other controller or processing unit on host 210. Processor 212 executes multiple agents or software programs (not specifically shown). The agents can be standalone programs and/or threads, processes, software modules, or other code and data to be operated on by processor 212.

During execution of operations by processor 212, an agent executed by the processor can request data and/or code that is not stored at host 210 (e.g., in a cache or main memory), and therefore should be obtained from memory 220. Storage controller 214 generates and processes memory access commands to memory 220 to perform the memory access. Storage controller 214 represents a circuit or logic or processor that manages access to memory 220. In one example, storage controller 214 is part of host 210. In one example, storage controller 214 is part of processor 212. In one example, storage controller 214 is integrated on a common substrate with processor 212. In one example, storage controller 214 separate chip from processor 212, and can be integrated in a multichip package (MCP) with processor 212.

Memory 220 includes controller 240, which represents a controller at the memory or storage device to process and service commands from storage controller 214. In one example, controller 240 represents a controller for a memory device. In one example, controller 240 represents a controller for a memory module. Memory 220 includes 3D array 222. In one example, 3D array 222 includes NAND memory blocks. In one example, 3D array 222 includes QLC NAND memory blocks.

As illustrated, bitlines (BL) intersect the planes of the tiers of wordlines (WL). As an example, each wordline WL[0:(N−1)] is a tier. There can be P bitlines (BL[0:(P−1)]). In one example, 3D array 222 is also divided into subblocks through SGD[0:(M−1)], which divide each wordline into separate segments within a tier or within a plane of wordlines. Alternatively, SGS can be subdivided to provide subblocks. In such a configuration, whereas SGS is shown to apply to multiple SGD lines, there could be multiple SGS lines to a single SGD line. SRC represents a common source.

Channel 250 represents a vertical channel of the 3D array. The channel refers to a vertical stack of bitcells that can be charged through a channel connector. In one example, the channels couple to the bitline. It will be understood that there can be spatial dependencies in the stable Vt state of a channel. For example, the flow of charge carriers in the channel can be different at the different ends of the channels. Thus, blocks with specific wordlines may show worse degradation than others. The operation of controller 240 to mitigate read disturb due to stable Vt in the channel can be set by thresholds and operation that mitigates the most sensitive of the wordlines.

Each label, WL[0], WL[1], SGD[0], and so forth, indicates a select signal provided by control logic of decode logic 224, or a select signal provided by control logic of sense/output logic 226. In one example, decode logic 224 includes selection logic to select each of the signal lines illustrated. In one example, sense/output logic 226 enables the sensing of the contents of bitcells of 3D array 222, for either a read operation or to write a value back to the array. The output can be for a read operation to send data back to host 210. A write operation would include writing to a buffer to apply the values to the array.

It will be understood that a signal line in 3D array 222 is a wire or trace or other conductor that provides charge from a driver to the various elements or components. A driver circuit decode logic 224 provides the charge to charge up each signal line to the desired voltage for the desired operation. Each signal line can have an associated voltage level associated with certain operations. For example, each wordline can have a select voltage and a deselect voltage to indicate, respectively, wordlines that are selected for an operation and wordlines that are not selected for an operation.

In 3D array 222, it will be understood that the length of the wordlines can be substantial. In one example, the number of tiers of wordlines is on the order of tens or dozens of wordlines (e.g., N=28, 32, 36, 70, or more). In one example, the number of subblocks is on the order of ones or tens (e.g., M=8, 76, or more). Typically, the number of bitlines in 3D array 222 will be on the order of hundreds to thousands (e.g., P=2K). Thus, in one example, each bitline is relatively short compared to the length of the wordlines.

Figure 3:
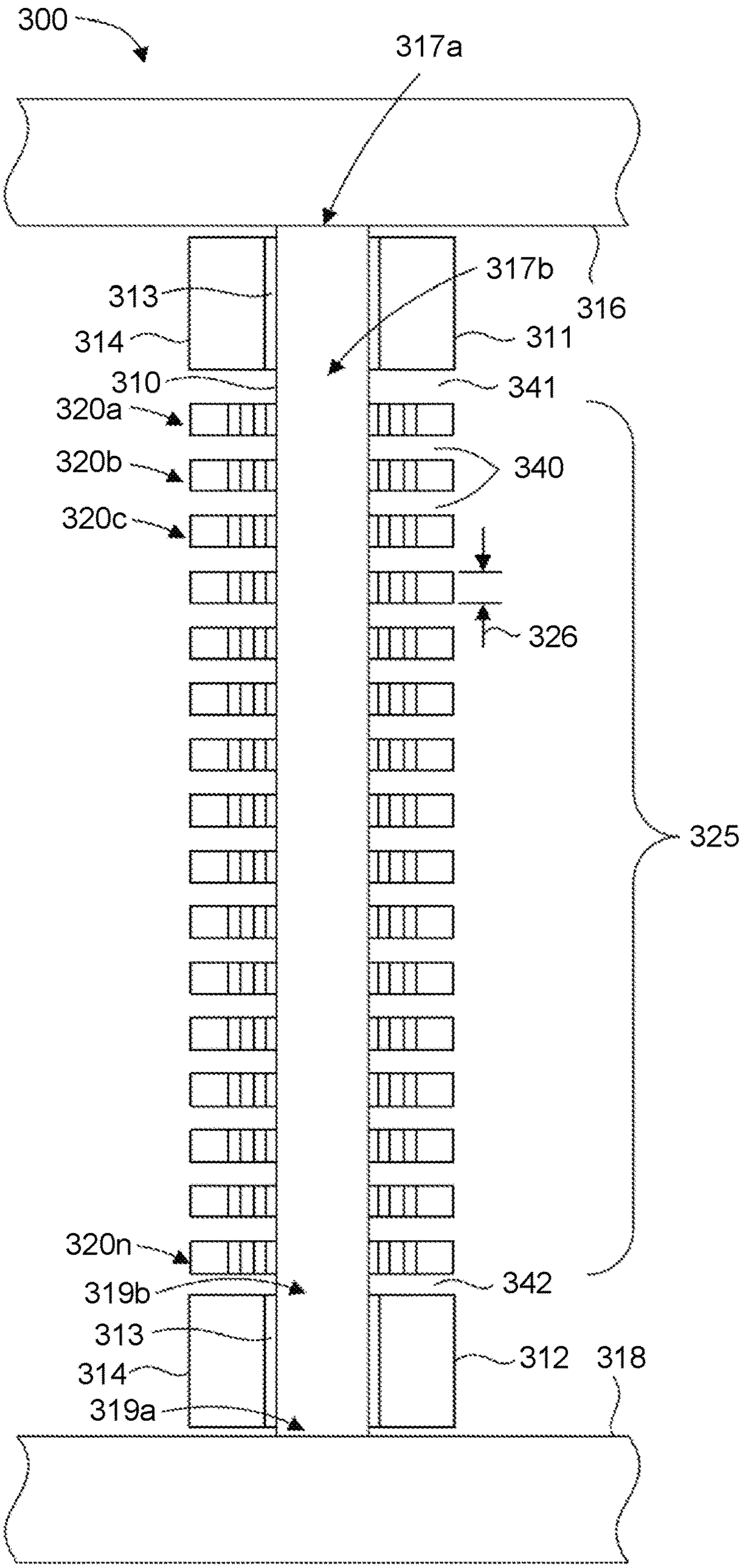
FIG. 3 is a diagram illustrating an abstracted representation of a portion of a solid-state memory component, according to one example.

FIG. 3 shows an abstracted representation of a portion of a solid-state memory component 300, according to one example. In general, the portion of the solid-state memory component includes a memory pillar 310 and memory cells 320*a-n* (i.e., a string 325 of memory cells, such as a NAND string) located adjacent to the memory pillar 310. Memory pillar 310 may also be referred to as a "memory hole" in some embodiments. Any suitable number of memory cells can be included. The memory pillar 310 can act as a channel region for the memory cells 320*a-n*, which can be coupled in series. For example, during operation of one or more of the memory cells 320*a-n* of the string, a channel can be formed in the memory pillar 310. The memory pillar 310 and the string of memory cells 320*a-n* can be oriented vertically, such as in a three-dimensional memory array. For example, memory cell 320*a* is located at a vertical level (e.g., near the top of the memory array) that is above a vertical level (e.g., near the bottom of the memory array) at which memory cell 320*n* is located. Generally, memory cells 320*a-n* can have any suitable structure. A simplified memory cell structure is provided for context and by way of an example. Therefore, it should be recognized that suitable memory cell structures can vary from the memory cell structure shown in FIG. 3.

Figure 4:
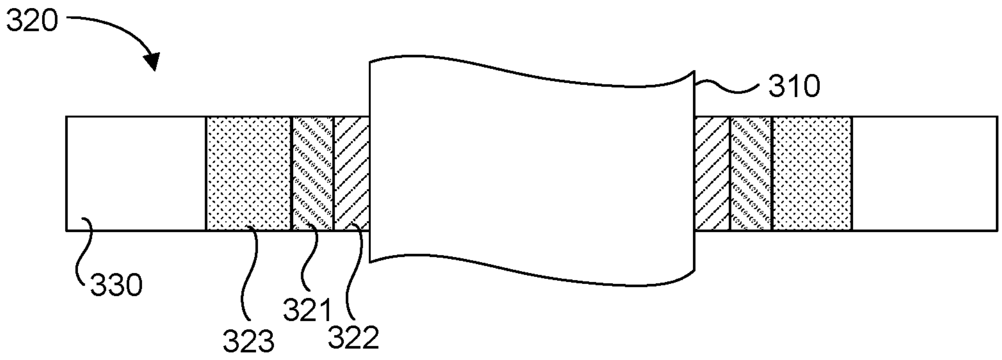
FIG. 4 is a diagram illustrating a simplified structure of a memory cell implemented in the solid-state memory component of FIG. 3.

Each memory cell 320*a-n* in this example can have a charge-storage structure (e.g., that may be a conductive floating gate, a dielectric charge trap, etc.). For example, as shown in FIG. 4, which illustrates a cross-section side view, memory pillar 310 and a representative memory cell 320, the memory cell 320 can have a charge-storage structure 321. Each memory cell 320*a-n* can also have a tunnel dielectric interposed between its charge-storage structure and the channel formed in memory pillar 310. For example, the memory cell 320 can have a tunnel dielectric 313 interposed between the charge-storage structure 321 and the memory pillar 310. In addition, each memory cell 320*a-n* can have a control gate (e.g., as a portion of or coupled to access lines, such as word lines). For example, the memory cell 320 can include a control gate 330. Each memory cell can have one or more dielectric materials or dielectric layers interposed between its charge-storage structure and the control gate. For example, the memory cell 320 can include dielectric layer 323 interposed between the charge-storage structure 321 and the control gate 330 referred elsewhere in the text as inter-poly dielectric (IPD).

Each memory cell 320 may be a non-volatile memory cell and may have a charge-storage structure 321, such as a floating gate that may be a semiconductor (e.g., polysilicon), a charge trap layer that may be a dielectric film, etc. Non-limiting examples of dielectrics that are suitable for charge traps include nitrides, high-dielectric constant (high-K) dielectrics, such as alumina ($Al_2O_3$) having a K of about 10, with embedded conductive particles (e.g., nano-dots), such as embedded metal particles or embedded nano-crystals (e.g., silicon, germanium, or metal crystals), a silicon rich dielectric, or $SiON/Si_3N_4$. Embodiments of floating-gate and charge trap cells are described and illustrated below.

With further reference to FIG. 3, a dielectric 340 (also called an isolation layer) may be interposed between successively adjacent memory cells 320*a-n* in the string 325. For example, a dielectric 340 may be interposed between at least the charge-storage structure 321, the dielectric 323, and the control gates 330 of successively adjacent memory cells 320*a-n*. A dielectric 341 may be interposed between an end (e.g., between memory cell 320*a*) of the string 325 and the select gate 311, and a dielectric 342 may be interposed between an opposite end (e.g., between memory cell 320*n*) of the string 325 and the select gate 312, as shown in FIG. 4.

In some embodiments, where the charge-storage structure 321 is a charge trap, the tunnel dielectric 322, the charge-storage structure 321, and the dielectric 323 can form a continuous structure that can be shared by (e.g., that may be common to) two or more of the memory cells 320*a-n*. For example, such a structure can be shared by or common to all of the memory cells 320*a-n*.

Each of the memory cells 320*a-n* can have a thickness (e.g., a channel length) 326. For example, the memory cells 320*a-n* can have the same channel length regardless of where in string 325 the memory cells are located. In some embodiments, at least one channel length of a memory cell can be different from another channel length of another memory cell.

Each memory cell 320*a-n* of the string 325 can be coupled in series with and can be between a select gate (e.g., a drain select gate) 311 adjacent to (e.g., in contact with) the pillar 310 and a select gate (e.g., a source select gate) 312 adjacent to (e.g., in contact with) the pillar 310. For a functional memory pillar, the pillar 310 is electrically coupled to a data line (e.g., a bit line 316), indicated at 317*a* and 317*b*. Thus, the select gate 311 can selectively couple the string 325 to the data line (e.g., the bit line 316). In addition, for a functional memory pillar, the pillar 310 is electrically coupled to a source line 318, indicated at 319*a* and 319*b*. Thus, the select gate 312 can selectively couple the string 325 to the source line 318. For example, the select gate 311 can be coupled in series with memory cell 320*a*, and the select gate 312 can be coupled in series with memory cell 320*n*. The select gates 311 and 312 can each include a gate dielectric 313 adjacent to (e.g., in contact with) pillar 310 and a control gate 314 adjacent to (e.g., in contact with) a corresponding gate dielectric 313.

Figure 5:
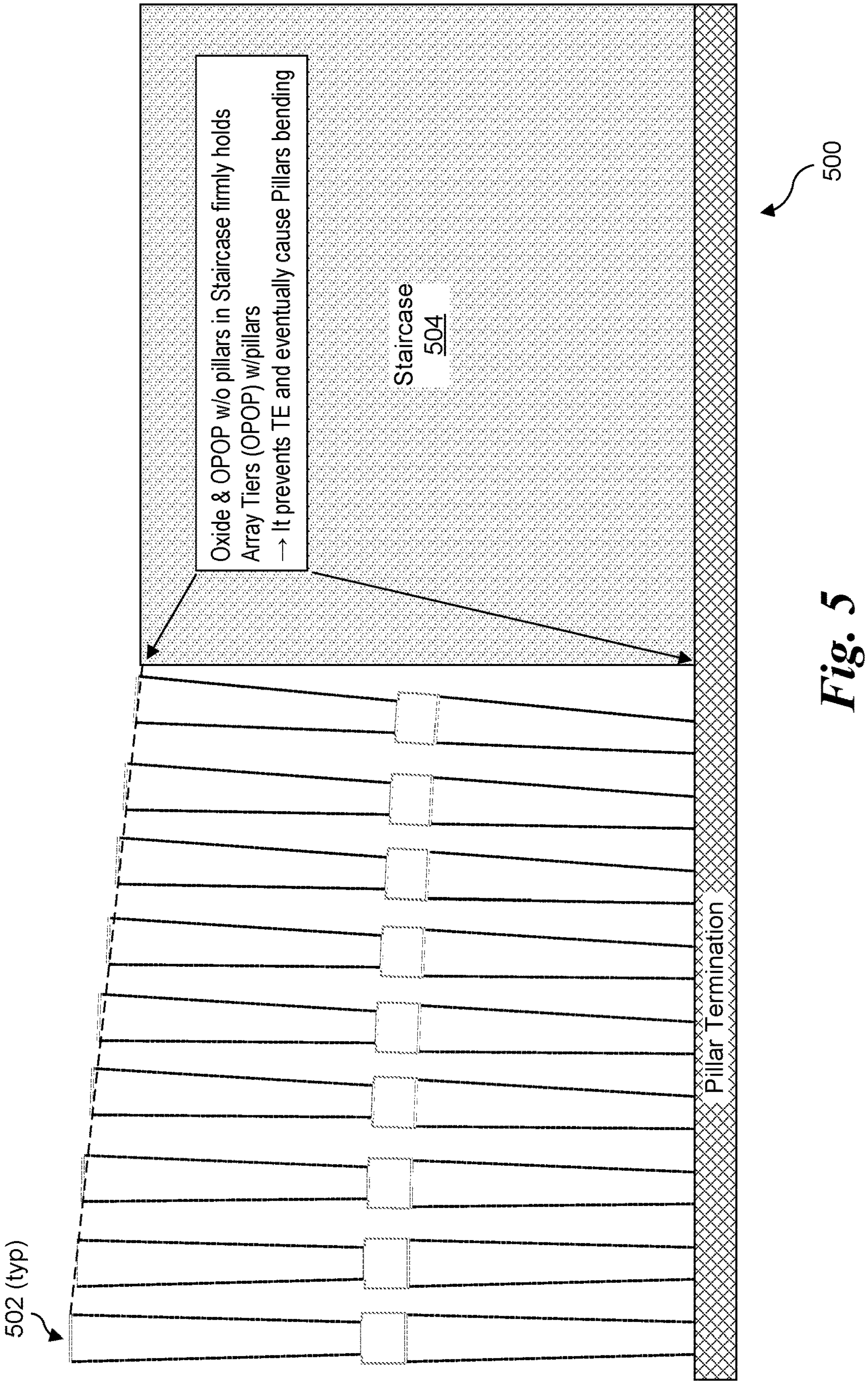
FIG. 5 is a diagram illustrating pillar bending using a current approach.

FIG. 5 shows an example of a current semiconductor structure design 500 where the edge of a pillar array 502 is immediately adjacent to a staircase region 504. This results in multiple pillar bending induced issues, including (1) upper deck to lower deck pillar misalignment, (2) under punch, (3) punch damage and (4) bitline-to-bitline short. Staircase region 504 includes an oxide-poly-oxide-poly (OPOP) staircase structure over which a (primarily) oxide material with vertical wordline drivers is formed. As a result, the staircase region does not have any issue with tier expansion (TE). Conversely, pillar array includes active and dummy pillars including channel structures that are formed using oxide growth, which causes tier expansion. This leads to pillar bending in the dummy pillars due to no tier expansion in staircase region 504.

Figure 6:
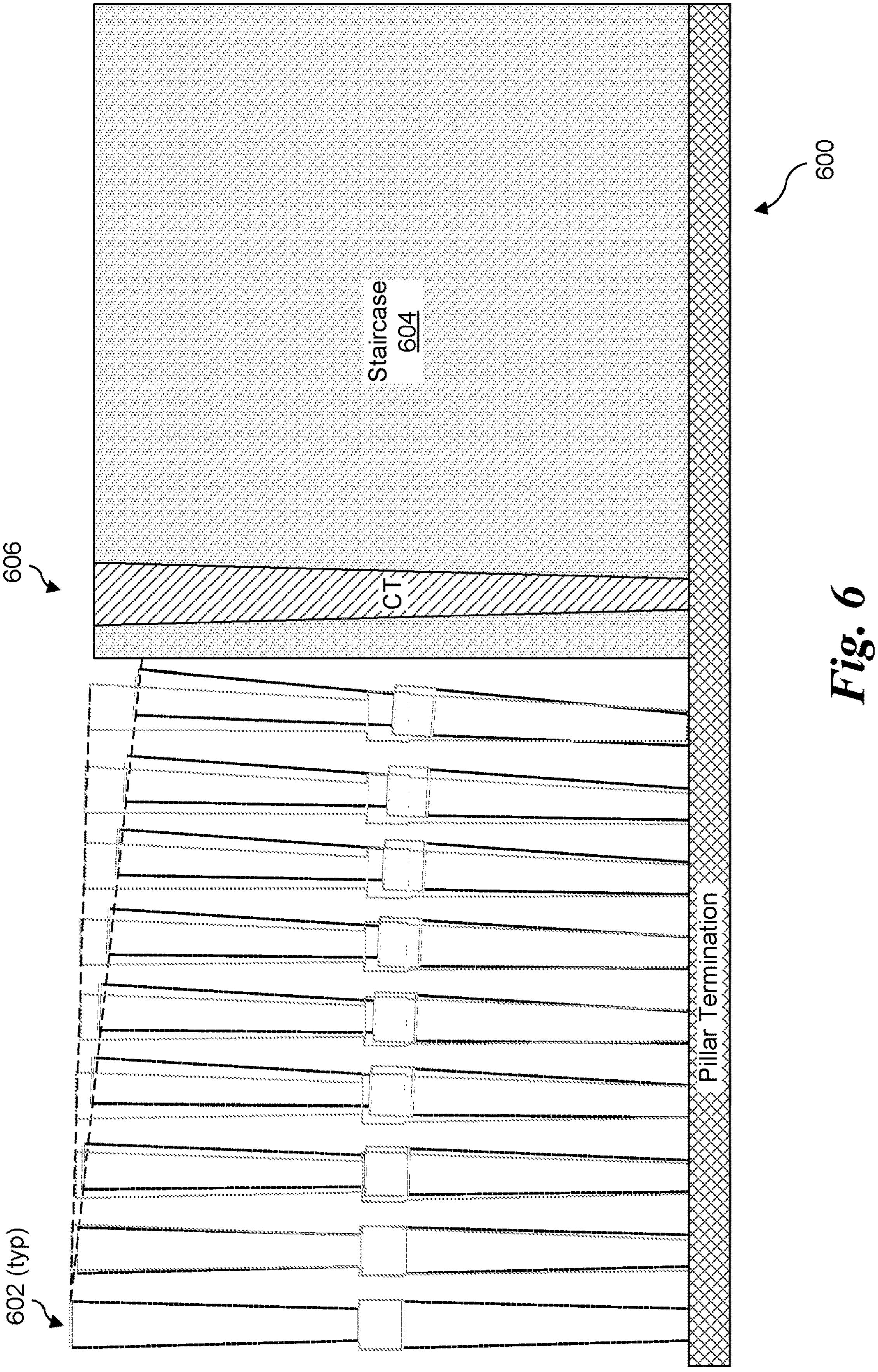
FIG. 6 is a diagram illustrating improved pillar bending when using a cut tier (CT) pattern approach.

FIG. 6 shows an improved semiconductor structure design 600 providing a reduction in pillar bending through use of a cut tier (CT) pattern 606. Under this approach, a cut tier pattern is introduced to delink the edge of the pillar array 602 from the staircase region 604. As shown, this intrinsically improves the pillar bending related issues.

Figure 7:
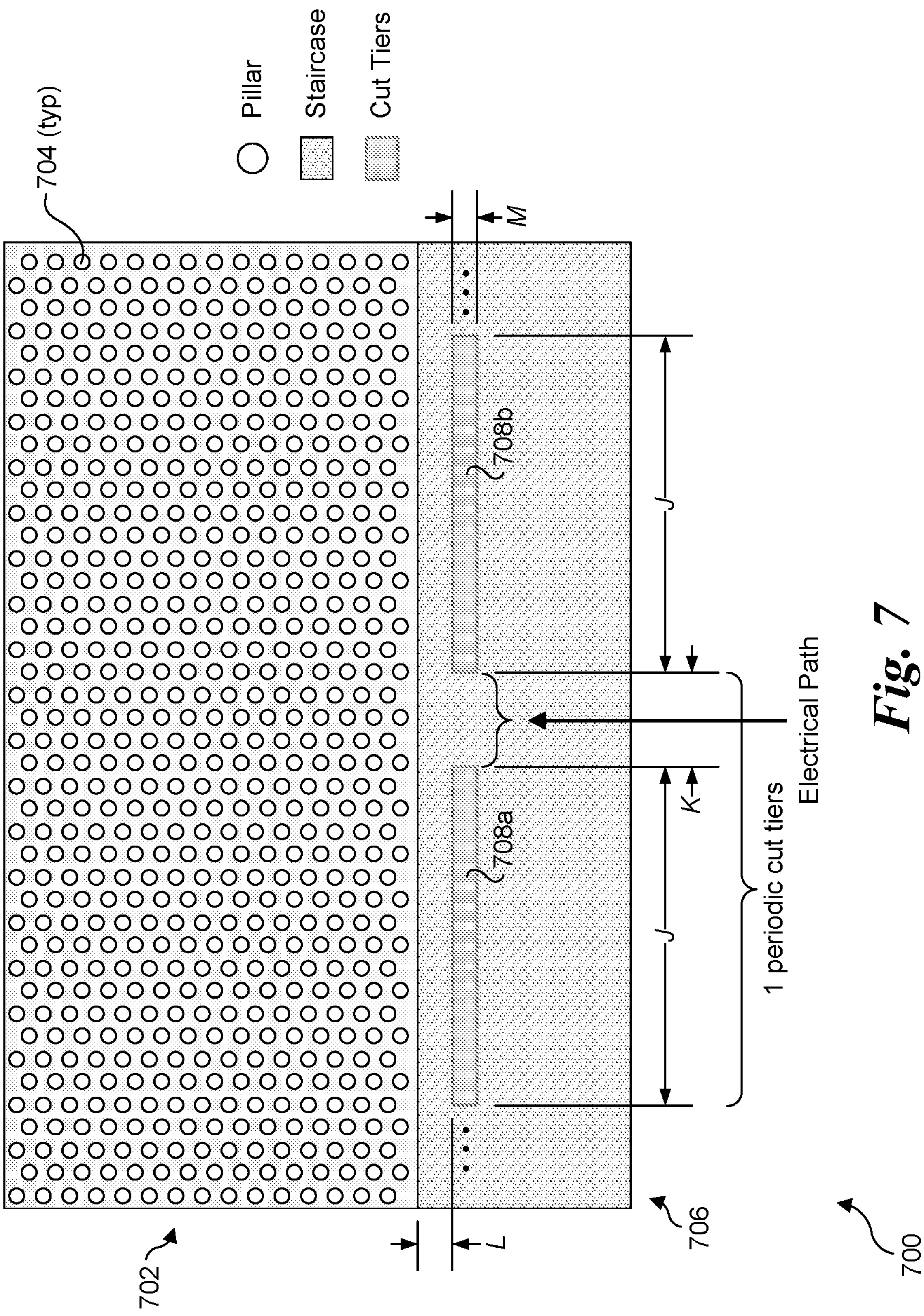
FIG. 7 is a diagram illustrating a plan view of a semiconductor structure employing a CT pattern, according to one embodiment.

In accordance with aspects of one embodiment, the cut tier design is added into the pillar reticle, with the cut tier feature will be formed by a pillar etch process and then filled with cell films. In order to ensure the electrical path between the staircase and pillar array, some breaks are purposely reserved on the cut tier feature, such as shown in plan (top) view of a semiconductor structure design 700 in FIG. 7.

Figure 9:
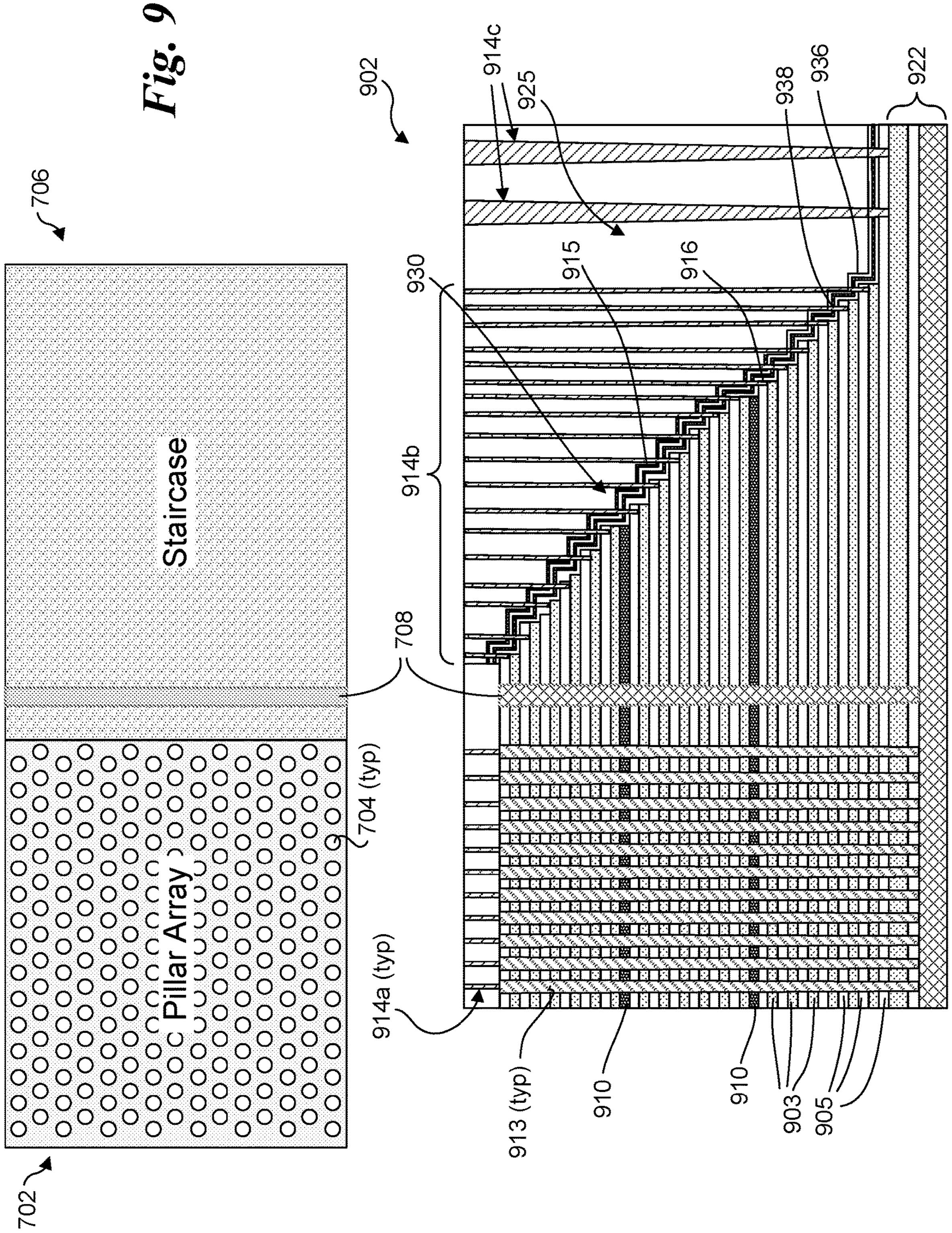
FIG. 9 shows a plan view and a cross-sectional view of a 3D NAND block employing a CT pattern, according to one embodiment.

As before, semiconductor structure design 700 includes an array 702 of pillars 704 that are adjacent to a staircase region 706, further details of which are shown in FIG. 9 and discussed below. Multiple cut tiers 708 are etched into staircase region 706, such as depicted by cut tiers 708*a* and 708*b*. The cut tiers are offset by distance L from the edge of pillar array 702, and have a nominal width of M and a length of J. The breaks have a width of K. In one non-limiting embodiment, L is 200 nm (nanometers), M is 100 nm, J is 2 um (micrometers), and K is 400 nm. As further shown in FIG. 7, the breaks provide an electrical path for connecting wordline circuitry in the circuit (wordline) layers of the staircase region. In one embodiment the pillars have a nominal diameter of 50-150 nm. The term "nominal" is used here since the diameter of the pillars and the width of the trenches used for the cut tiers may vary with depth. It is also noted that the diameter of the pillars and (optionally) trenches may have a step change, such as shown in FIGS. 5 and 6 for the pillars.

Figure 8A:
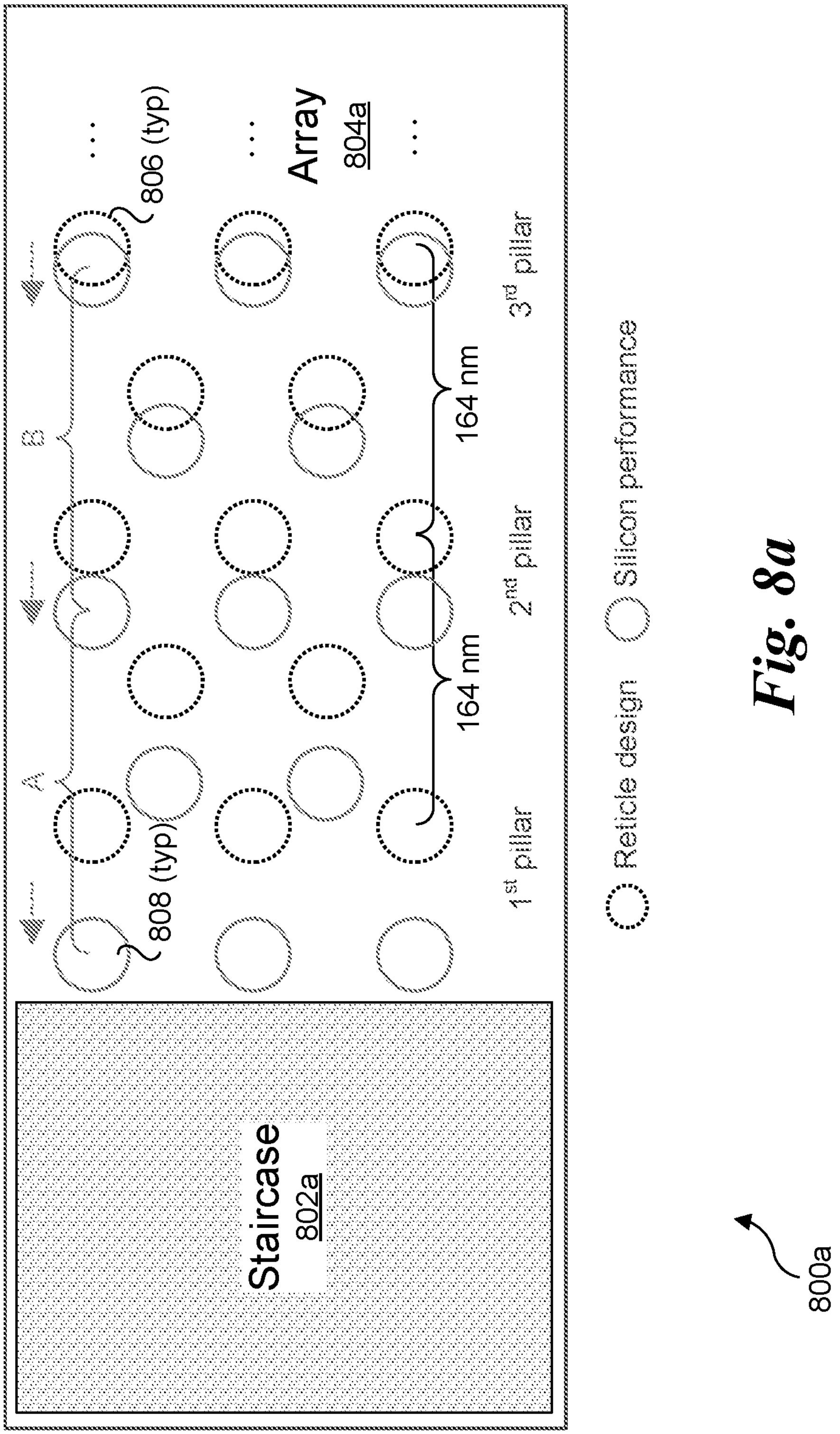
FIGS. 8*a* and 8*b* are diagrams respectively illustrating silicon performance using is a current approach and using a CT pattern approach.
Figure 8B:
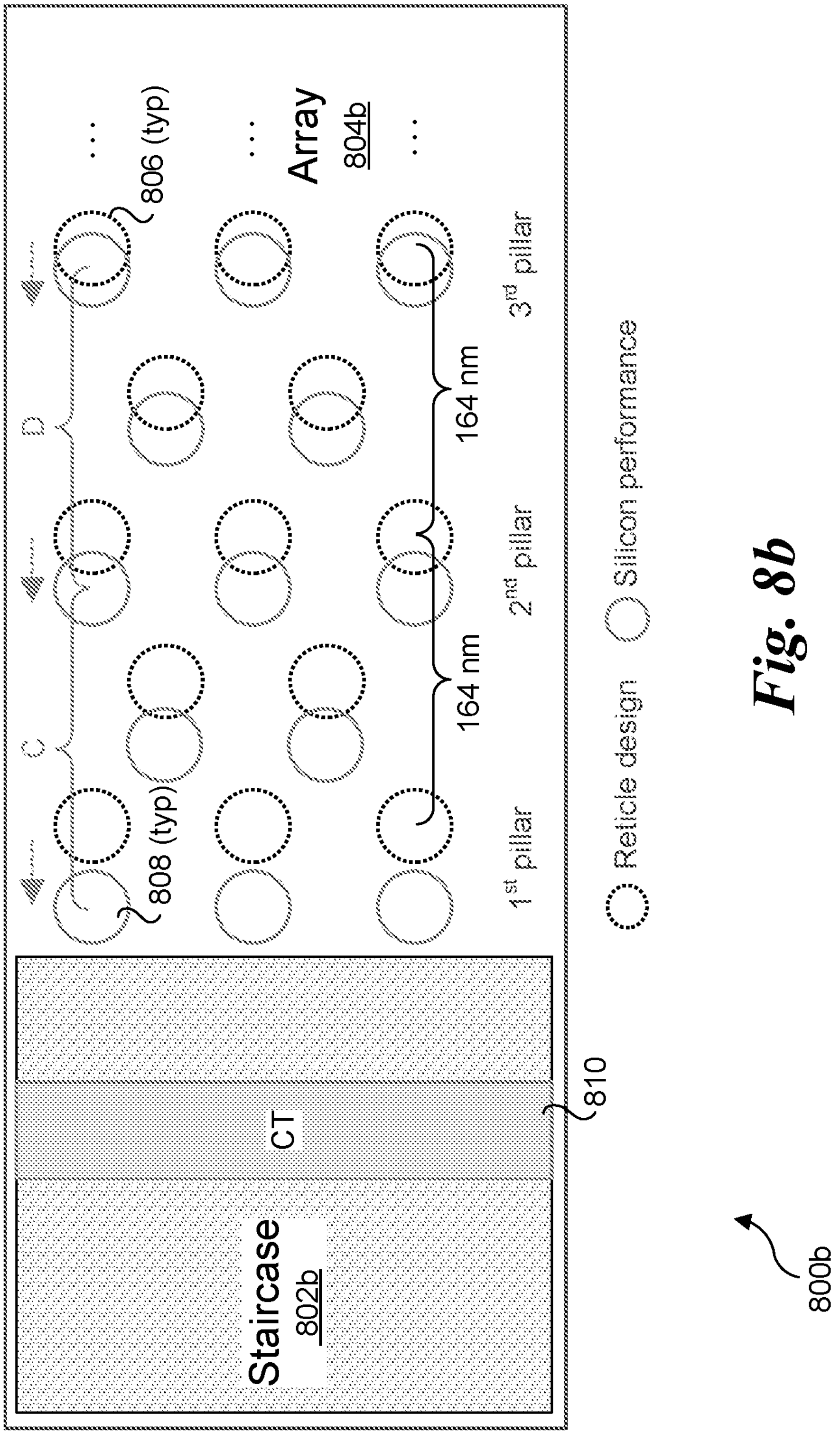

Diagrams 800*a* and 800*b* illustrate comparisons of silicon performance (i.e., performance using actual silicon 3D NAND devices) under the current approach and using the cut tiers approach are respectively shown in FIGS. 8*a* and 8*b*. Diagram 800*a* depicts a staircase region 802*a* and a pillar array 804*a*. The dashed circles 806 for the reticle design correspond to the lithographic design for the pillars used during pillar etching. The closed circles 808 for the silicon performance represent the location of the top of the pillars relative to reticle design, which shift toward to staircase side due to tier expansion induced pillar bending. If there was no pillar bending, the silicon performance and the reticle design would match. In this non-limiting example, the pillars have a design pitch of 164 nm; however, this is merely one example, as other pitches/spacings may be used. The offsets between the reticle design circles and the silicon performance circles are exaggerated in FIGS. 8*a* and 8*b* for emphasis.

As shown in diagram 800*a*, the pitch distance between the silicon performance circles 808 from the $1^{st}$ pillar and the $2^{nd}$ pillar is a distance A, while the pitch difference between the silicon performance circles 808 from the $2^{nd}$ pillar and the $3^{rd}$ pillar is distance B. The use of different distances A and B is to show that the amount of bending for adjacent pillars may vary a small amount. Also, while FIGS. 8*a* and 8*b* depict the silicon performance of pillars in the first three columns adjacent staircase region 802*a*, those skilled in the art will recognize that in an actual device that the offset between the reticle design and silicon performance for the $3^{rd}$ pillar column would correspond to pillars many columns away from the $1^{st}$ pillar column and the offset between the reticle design and silicon performance for the $2^{nd}$ pillar column would represent an offset approximately halfway between the $1^{st}$ column pillars and the $3^{rd}$ column pillars.

Diagram 800*b* depicts a staircase region 802*b* with a CT 810 and a pillar array 804*b*. The spacing between the silicon performance circles 808 from the $1^{st}$ pillar and the $2^{nd}$ pillar is a distance C, while the spacing between the silicon performance circles 808 from the $2^{nd}$ pillar and the $3^{rd}$ pillar is distance D. As before, the use of different distances C and D is to show the amount of bending for adjacent pillars may vary a small amount. A comparison between diagrams 800*a* and 800*b* shows distances C and D are less than distances A and B, demonstrating reduced pillar bending when using the CT approach.

The pitch distances (A, B, C, D, . . . ) are measured using a Scanning Electron Microscope (SEM) tool. Under one embodiment, the cut tier pattern approach provides a pillar bending improvement of approximately 90 nm for the $1^{st}$ tier pillars adjacent to the staircase region using a reticle pillar pitch of 164 nm.

Reference is now made to FIG. 9, which shows a plan view (above) and a cross-sectional view of a 3D NAND block 902. Block 902 includes a word line stack including a plurality of word lines 903 and a plurality of interlayer dielectrics 905. Generally, the structure of block 902 is simplified for clarity and understanding, and it is to be understood that both the depiction of the stack of layers in the structure are merely schematic depictions, and that a stack as implemented in a 3D NAND product may have any number of word lines, such as up to about 160, or even more, word lines. FIG. 9 further shows pillars 913, first contact structures 914*a*, second contact structures 914*b* and third contact structures 914*c*, substrate structure 922, and staircase 925. Block 902 further shows additional stopping layers 910 which may be provided between groups of stacks of word lines 903 and interlayer dielectrics 905 by way of example. An insulating layer is provided to cover staircase 925. The insulating layer may envelope staircase 925, and may for example include a bonding dielectric layer, having a predetermined thickness, and including, for example, at least one of, for example, SiO, SiN, SiCN, SiOC, SiON, and SiOCN. Insulating layer may, for example, include silicon dioxide or any other suitable second etch stop layer.

As seen in FIG. 9, a 3D NAND block 902 or stack may include alternating layers of word lines and interlayer dielectrics, where contact structures (not separately shown) are needed to provide interconnections between the word lines 903 and the substrate 922 on the one hand, and the corresponding bit lines (not shown) on the other hand. The interconnections (including contact structures) may be created by first creating a lithographic pattern for vias, etching vias down to the corresponding conductive layers below, and thereafter filling the vias with a conductive material to achieve second and third contact structures 914*b* and 914*c*. In order to etch the vias all the way down to each corresponding conductive layer, an initial stage may involve the etching of the vias (that is, the vias to extend down to the staircase and possibly also to the substrate structure) to stop at a first etch stop layer 915, such as one including nitride.

A subsequent stage, not separately shown, for the formation of interconnections between the word lines and the substrate 922 on the one hand, and bit lines on the other hand, is an etch process that etches the first etch stop layer and therefore has high selectivity to the first etch stop layer, so that it can stop at an underlying second etch stop layer 916, such as an second etch stop layer 916 including an oxide.

The staircase 925 may comprise a stepped structure, such as illustrated in FIG. 9. The stepped structure may comprise a sandwich of etch stop layers 930 including etch stop layers 936 and 938. Generally, various known staircase structures and associated fabrication processes may be used, with the particular staircase structure and fabrication process being outside the scope of this disclosure.

Next generation 3D NAND memory devices present more tiers (more stacks of word lines and interlayer dielectrics) and therefore more depth compared with those of their predecessors. In one embodiment an oxide-poly-oxide-poly (OPOP) staircase (corresponding alternating dielectric layers 905 and word lines 903) is employed. However, this is merely exemplary and non-limiting, as other materials and structures known in the art may be used.

Figure 9A:
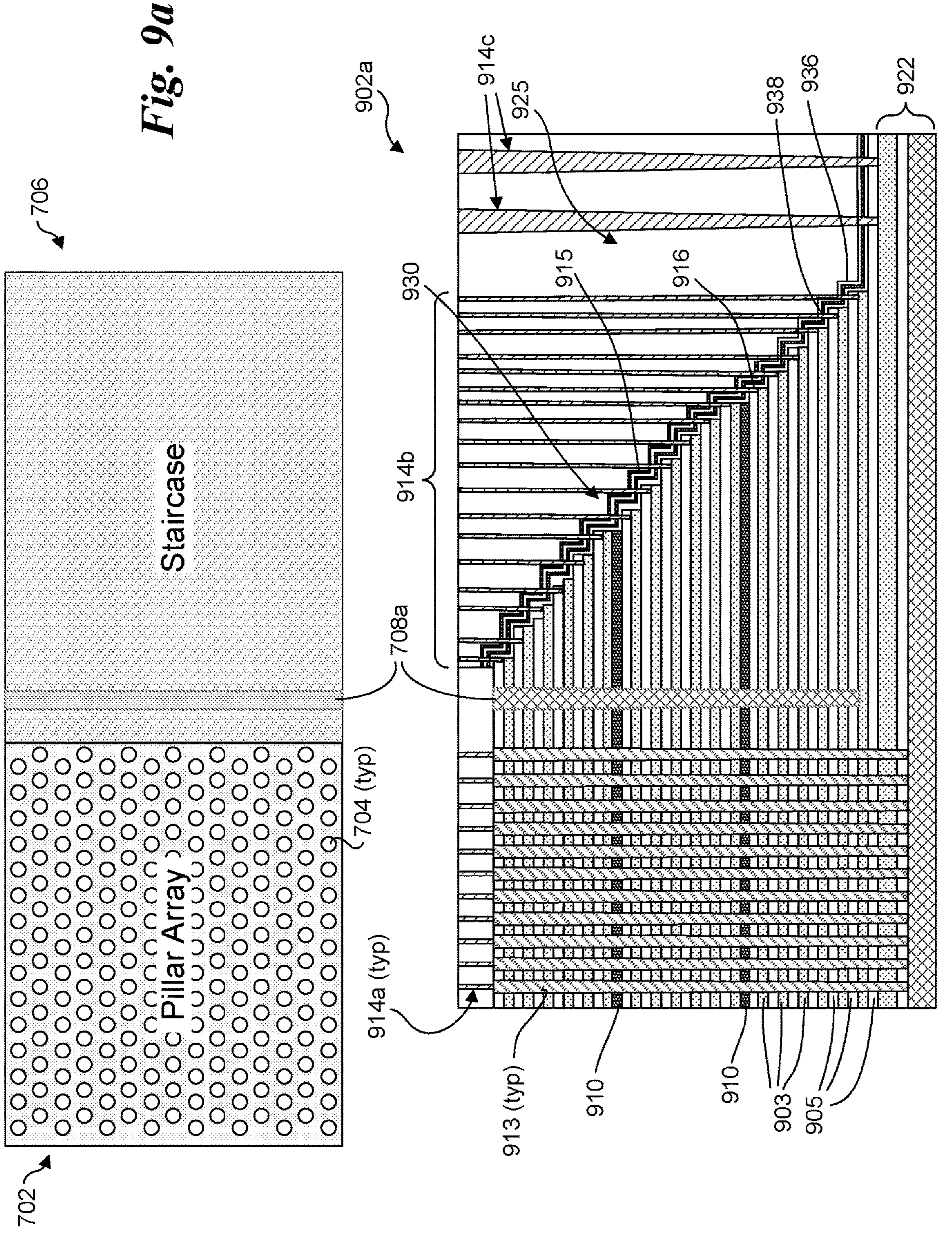
FIG. 9*a* shows a plan view and a cross-sectional view of a 3D NAND block employing a CT pattern having a depth that is less than the depth of the pillars, according to one embodiment.

FIG. 9*a* shows a 3D NAND block 902*a* illustrating a variant of 3D NAND block 902 in which cut tier 708*a* has a depth that is less than the depth of pillars 913. Generally, the pillars and the cut tiers (e.g., trenches) may have the same depth or different depths, with a minimum trench to pillar depth ratio of approximately 50%. One technique for forming pillars and cut tiers to have the same depth is to use a mask to etch the pillar holes and the cut tiers at the same time, although other approaches may be used to obtain similar results. For pillars and cut tiers having different depths, generally different processing steps with separate masks may be employed.

Figure 10:
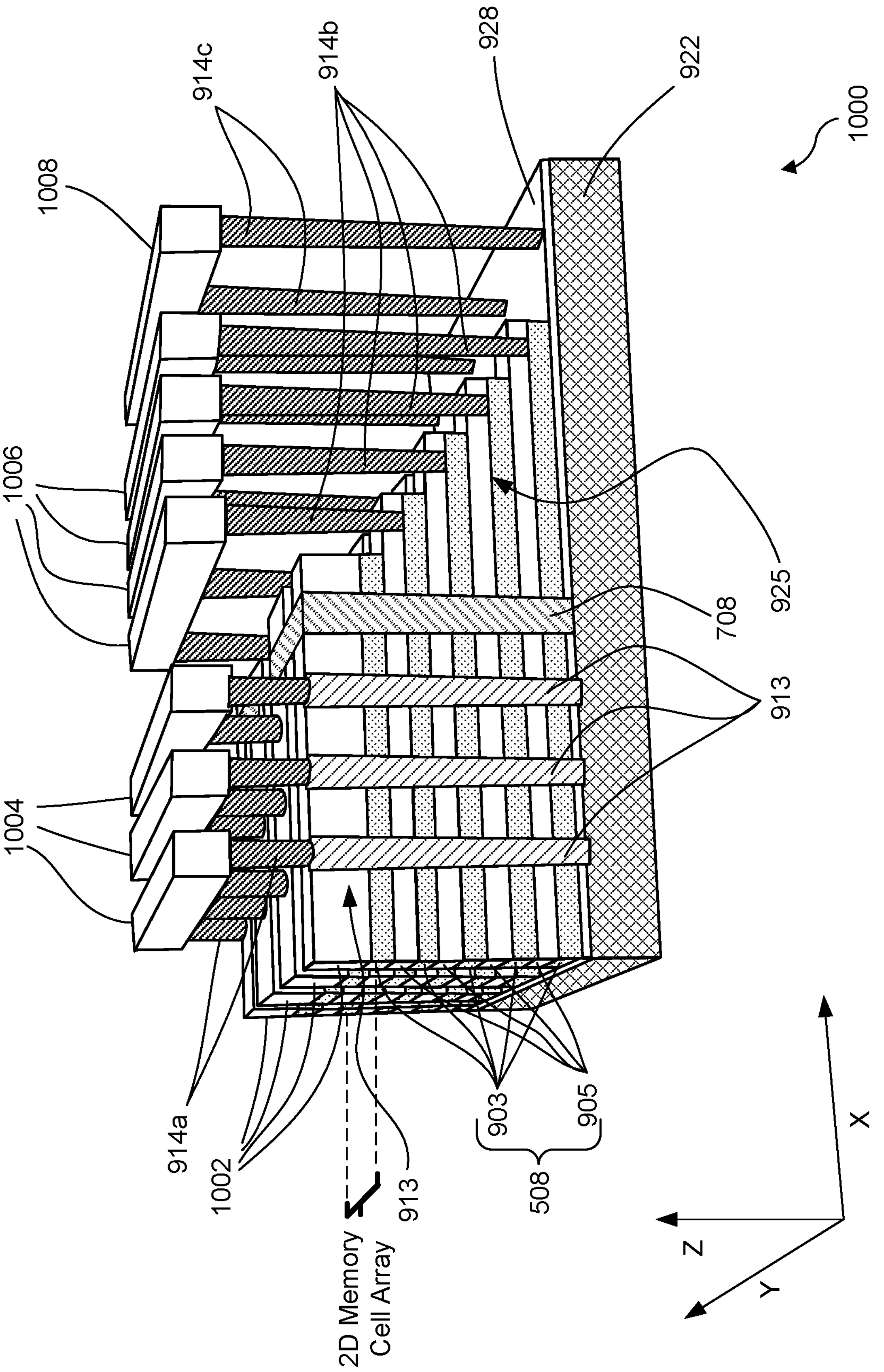
FIG. 10 illustrates a schematic, perspective view of a 3D NAND device, according to one embodiment.

FIG. 10 illustrates an example perspective view diagram of a tile 1000 of NAND flash memory arrays, having like-numbered components to those shown in FIG. 9 above. A tile of memory blocks includes several memory blocks, e.g., 200 blocks, where each block is comprised of a stack (e.g., a 32 tier stack) of 2D memory cell arrays. Each memory cell block 1002 includes a word line stack, each stack including a plurality of word lines and a plurality of interlayer dielectric s/interlayer dielectric layers 905. The word lines 903 are interposed between the interlayer dielectrics 905 (collectively, a word line stack 508) in an alternating manner, according to one embodiment. The word lines 903 are a simplified representations of a number of word lines (e.g., 32 word lines or more) that may be included in a NAND 3D memory array, such as a NAND 3D memory array corresponding to FIG. 2. At least some of word lines 903 may correspond to the word lines WL[0, 1, . . . N−1] of FIG. 2.

In addition to the like-numbered structures and components shown in FIG. 9, tile 1000 further includes bitlines 1004, contact structures 1006 and a contract structure 1008. Bitlines are connected to the channels of pillars 913 via first contact structures 914*a*. Contact structures 1006 are connected to wordlines 903 via second contact structures 914*b*, which may also be referred to as vertical wordline drivers. Contact structure 1008 is connected to an epitaxial layer 928 above substrate structure 922 via third contact structures 914*c*.

Figure 11:
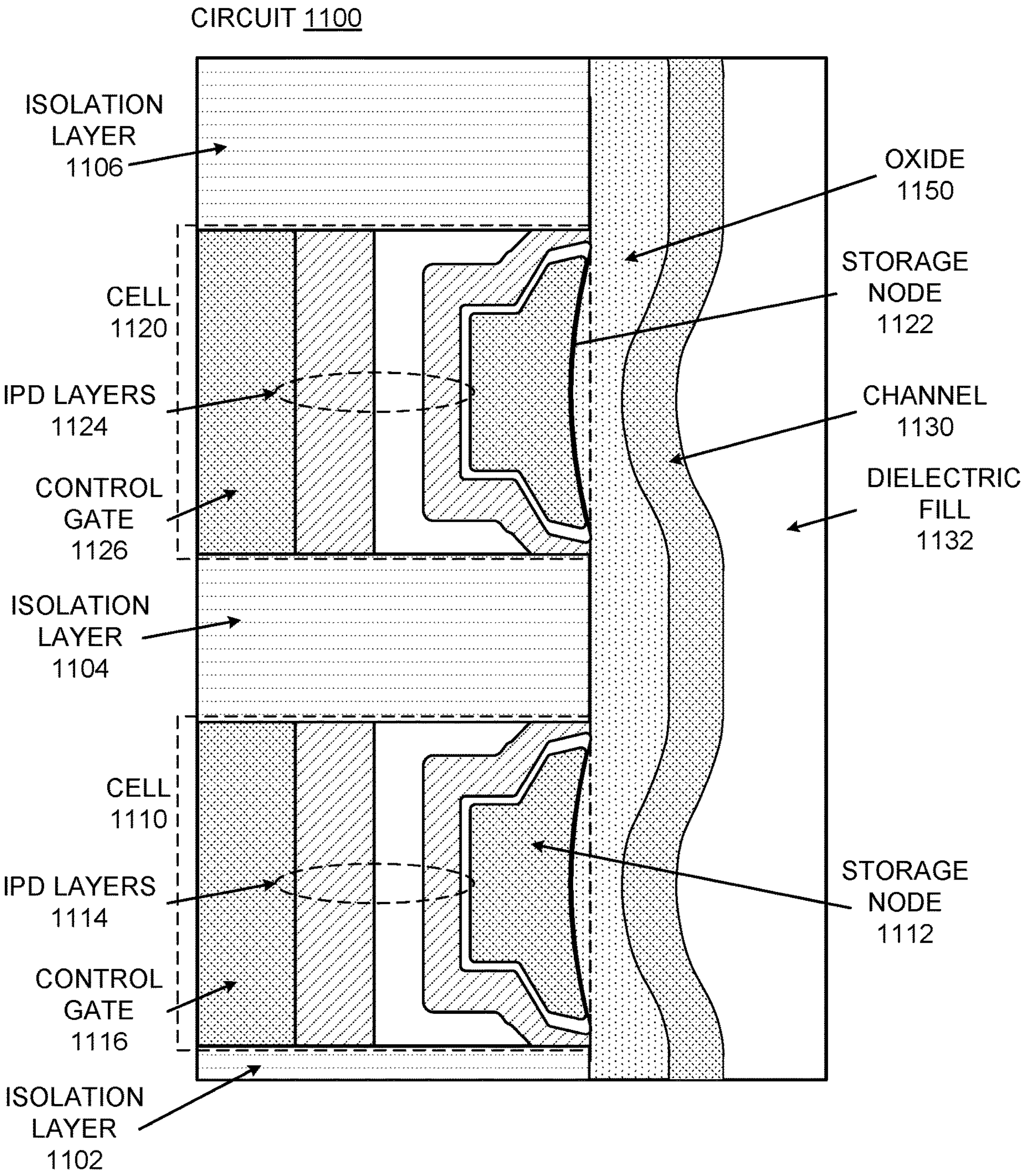
FIG. 11 is a diagram representing a cross-section view of a portion of a vertical channel in a 3D memory structure, according to one embodiment.

FIG. 11 shows a circuit 1100 that represents a portion of a vertical channel in a 3D memory structure, such as a 3D NAND array in 3D NAND block 902. Circuit 1100 is not necessarily to scale and illustrates non-limiting example of features rather than providing an exact representation of features. Also, the shape of some of the cell structures are simplified for illustrative purposes.

Circuit 1100 depicts two memory cells, cell 1110 and cell 1120 and three isolation layers 1102, 1104, and 1106 (which may also be called separation layers). Although circuit 1100 is not necessarily to scale, the isolation layers between the cells are generally thinner than the cells themselves. The cells illustrate one example of a memory cell structure, with semiconductor indicated as storage node 1112 and storage node 1122, respectively. Storage node 1112 is separated from control gate poly by one or more IPD (inter-poly dielectric) layers 1114. The conductor layer poly is a layer of conductor to control access to the storage node. The conductor layer poly for storage node 1112 is represented as control gate 1116. Likewise, storage node 1122 is separated from conductor layer poly by one or more IPD layers 1124, represented as control gate 1126. The number of IPD layer and the structure of those layers is not important for circuit 1100, as long as the storage node is electrically isolated from the conductor layer.

In one example, circuit 1100 includes an oxide 1150, and a channel conductor 1130 with a dielectric fill 1132. 3D NAND typically uses polycrystalline (poly) material for channel 1130, such as but not limited to polycrystalline silicon (also referred to as polysilicon). In one example, channel 1130 may be p-type or n-type doped poly. In one example, channel 1130 is a lightly doped ($1e17/cm^3$-$5e17/cm^3$) polysilicon material such as n-type (electron carrier majority) or p-type (hole carrier majority) channel.

Figure 12:
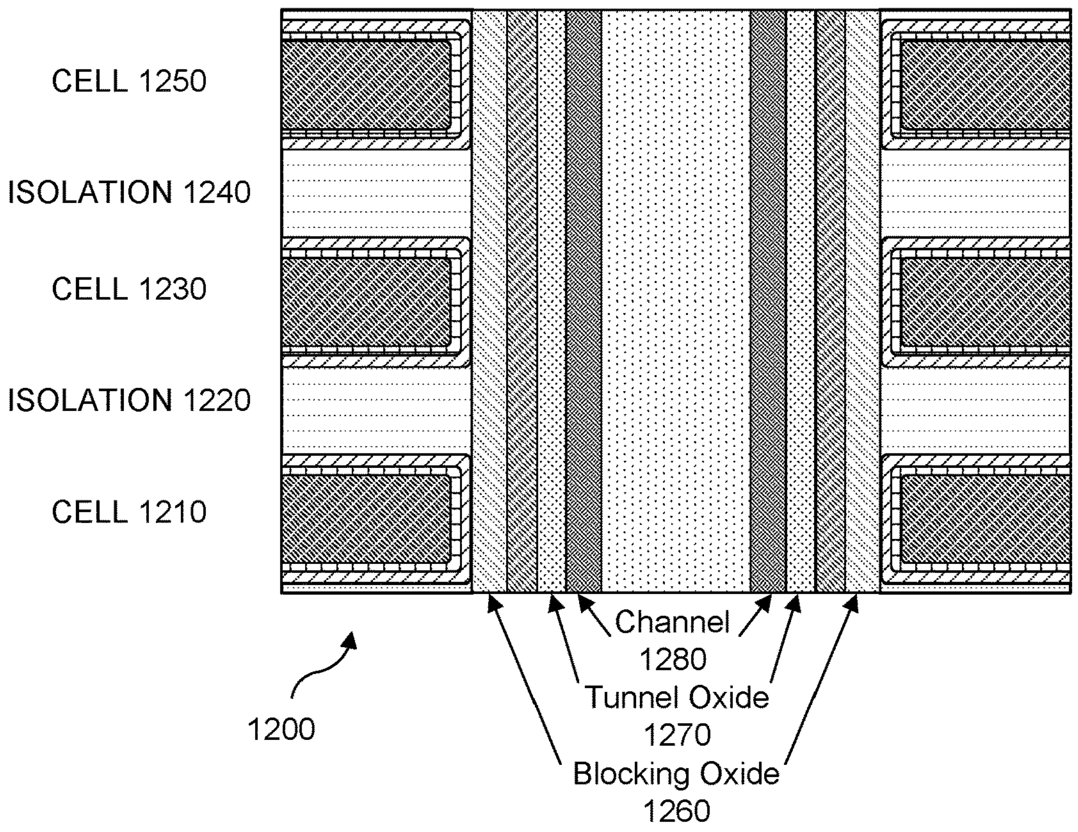
FIG. 12 shows cross sections of the structure of a 3D memory device using Charge-Trap Flash (CTF) cells.
Figure 12:
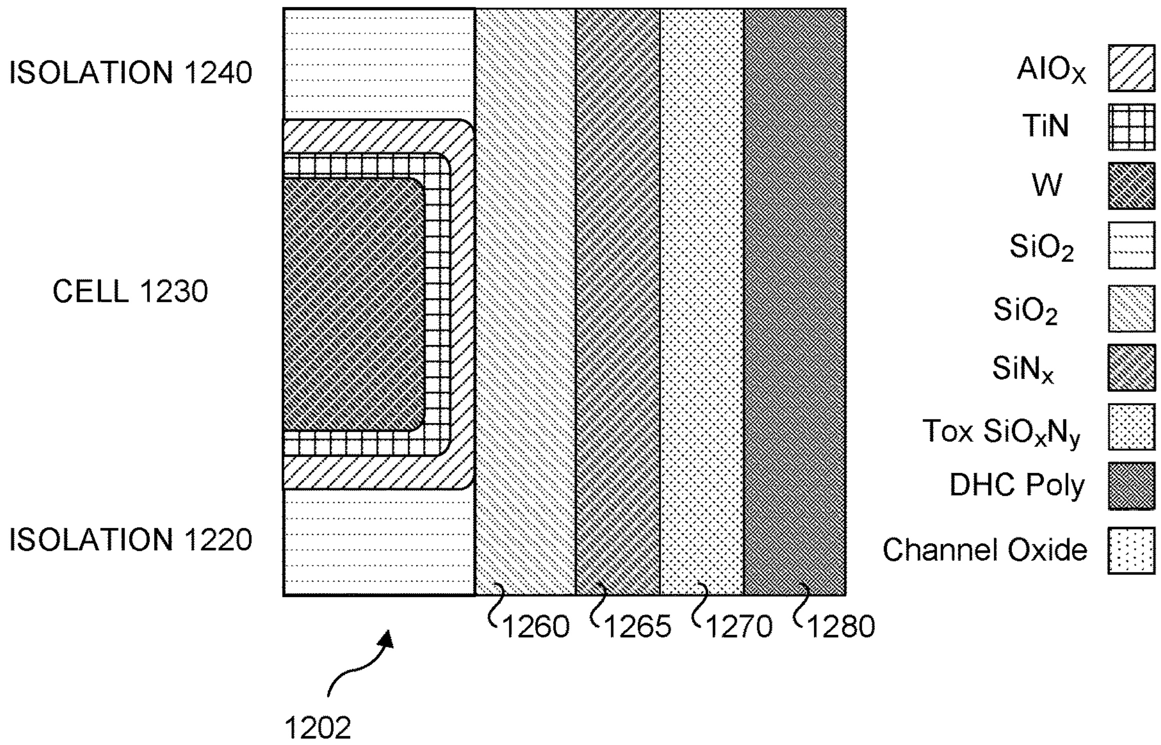

3D NAND block 902 may employ other memory cell structures, such as Charge-Trap Flash (CTF) cells. For example, FIG. 12 shows cross sections 1200 and 1202 of the structure of a 3D memory device using CTF cells. As shown in cross section 1200, the 3D memory structure includes cells 1210, 1230, and 1250 separated by isolation (layers) 1220 and 1240. The material that is added (e.g., via deposition and/or growth) includes a blocking dielectric film (e.g., a blocking oxide 1260), a charge-trap dielectric film 1265, a tunnel dielectric (e.g., a tunnel oxide 1270), and a poly-Si channel 1280. The memory hole is then filled with channel oxide to complete the memory pillar. Known fabrication techniques may be employed to form one or more CTF cell films (e.g., blocking oxide 1260 and tunnel oxide 1270).

Figure 13:
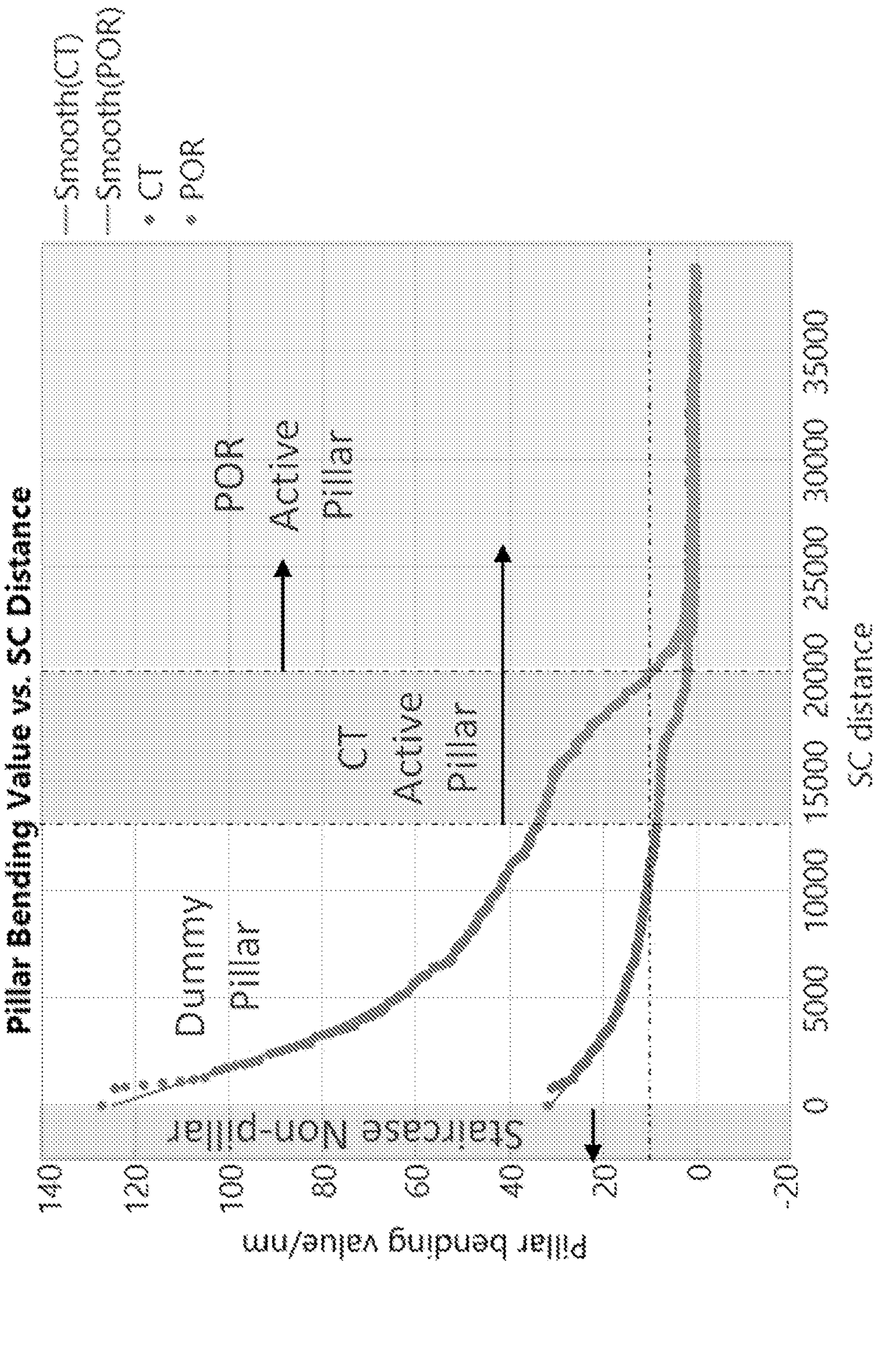
FIG. 13 is a graph depicting pillar bending vs. staircase distance comparing performance between a current approach and the CT pattern approach, according to one embodiment.

FIG. 13 shows a graph depicting pillar bending vs. staircase distance comparing performance between a current approach (plan of record or POR) and using the CT approach. As shown, the CT approach provides a substantial improvement over the current POR approach. It is noted in this example that the POR Active pillar region and CT Active pillar regions represents regions in the pillar array in which operative pillars and associated memory cells reside, while the area between the staircase and CT Active pillar region is occupied by "dummy" pillars. Dummy pillars are commonly used in 3D memory structures such as 3D NAND structures for various purposes—those purposes are generally outside the scope of this disclosure.

It is noted that the pillar bending in the Figures herein are exaggerated for illustrative purposes, and the pillars and the degree of pending are not to scale in some Figures. Also, the tops of pillars and the top of an adjacent staircase structure may differ from that shown in some Figures.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Italicized letters, such as 'J', 'K', 'L', 'M', etc. in the foregoing detailed description are used to depict an integer number, and the use of a particular letter is not limited to particular embodiments. Moreover, the same letter may be used in separate claims to represent separate integer numbers, or different letters may be used. In addition, use of a particular letter in the detailed description may or may not match the letter used in a claim that pertains to the same subject matter in the detailed description.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A three-dimensional (3D) NAND memory structure, comprising:

a pillar array region including;

a plurality of memory tiers comprising wordline layers interposed between isolation layers, each memory tier comprising a two-dimensional (2D) array of memory cells; and a plurality of pillars passing vertically through memory cells in the wordline layers and passing through the isolation layers;

a staircase structure, including a portion of the wordline layers, disposed adjacent to the pillar array region and including vertical wordline drivers coupled to the wordline layers; and a cut tier pattern comprising one or more vertical trenches formed in the staircase structure toward a side of the staircase structure adjacent to the pillar array region;

wherein the one or more vertical trenches include at least three vertical trenches and have a first horizontal length; and wherein the at least three vertical trenches extend, and are aligned to one another, along the first horizontal length.

2. The 3D NAND memory structure of claim 1, wherein the pillar array region includes an active pillar region and a dummy pillar region disposed between the active pillar region and the staircase structure.

3. The 3D NAND memory structure of claim 1, further comprising a substrate over which the plurality of memory tiers is formed, wherein the plurality of pillars and the one or more vertical trenches have a depth that extends to the substrate.

4. The 3D NAND memory structure of claim 1, wherein the one or more vertical trenches have a depth that does not pass through at least one memory tier.

5. The 3D NAND memory structure of claim 1, wherein the cut tier pattern comprises an alternating pattern of vertical trenches, and the first horizontal length is separated by a break having a second horizontal length, and wherein the alternating pattern includes at least one break that is used as an electrical path for routing wordline wires or traces.

6. The 3D NAND memory structure of claim 1, wherein the memory cells comprise floating gate cells.

7. The 3D NAND memory structure of claim 1, wherein the memory cells comprise Charge-Trap Flash (CTF) cells.

8. The 3D NAND memory structure of claim 1, wherein the one or more vertical trenches have a width at the top of the one or more vertical trenches of at least 100 nanometers.

9. The 3D NAND memory structure of claim 1, wherein the pillars have a nominal diameter, and wherein the one or more vertical trenches have a nominal width that is greater than the nominal diameter of the pillars.

10. The 3D NAND memory structure of claim 1, wherein a pillar comprises a channel structure having at least one oxide layer that is formed by growing an oxide on a sidewall of an etched hole.

11. A method for reducing pillar bending in a semiconductor structure, comprising:

forming a pillar array region, further including:

forming a plurality of memory tiers including a stack of wordline layers interposed between isolation layers, each memory tier including a two-dimensional (2D) array of memory cells; and forming a plurality of pillars adjacent to a staircase structure; and forming a cut tier pattern comprising one or more vertical trenches in the staircase structure toward a side of the staircase structure adjacent to the pillar array region;

wherein the one or more vertical trenches include at least three vertical trenches and have a first horizontal length; and wherein the at least three vertical trenches extend, and are aligned to one another, along the first horizontal length.

12. The method of claim 11, wherein the pillar array region include an active pillar region and a dummy pillar region disposed between the active pillar region and the staircase structure.

13. The method of claim 11, wherein the semiconductor structure further comprises a substrate over which the stack of wordline layers interposed with isolation layers are formed, wherein the plurality of pillars and the one or more vertical trenches have a depth that extends to the substrate.

14. The method of claim 11, wherein the one or more vertical trenches have a depth that does not pass through at least one wordline layer.

15. The method of claim 11, where the cut tier pattern comprises an alternating pattern of vertical trenches, and the first horizontal length is separated by a break having a second horizontal length, further comprising forming wordline wires or traces in wordline layers through which the vertical trenches pass such that the wordline wires or traces are routed through at least one break in the cut tier pattern.

16. The method of claim 11, wherein a pillar comprises a channel structure that is formed by:

etching a hole; and forming at least one oxide layer by growing an oxide on a sidewall of the etched hole.

17. A system, comprising:

a host, including a processor; and a three-dimensional (3D) NAND memory device, coupled to the host, including one or more memory blocks comprising:

a pillar array region including:

a plurality of memory tiers comprising wordline layers interposed between isolation layers, each memory tier comprising a two-dimensional (2D) array of memory cells; and a plurality of pillars passing vertically through memory cells in the wordline layers and passing through the isolation layers;

a staircase structure, including a portion of the wordline layers, disposed adjacent to the pillar array region and including contact structures coupled to the wordline layers; and a cut tier pattern comprising one or more vertical trenches formed in the staircase structure toward a side of the staircase structure adjacent to the pillar array region;

wherein the one or more vertical trenches include at least three vertical trenches and have a first horizontal length; and wherein the at least three vertical trenches extend, and are aligned to one another, along the first horizontal length.

18. The system of claim 17, wherein the cut tier pattern comprises an alternating pattern of vertical trenches, and the having a first horizontal length is separated by a break having a second horizontal length, and wherein the alternating pattern includes at least one break that is used as an electrical path for routing wordline wires or traces.

19. The 3D NAND memory structure of claim 1, wherein each of the one or more vertical trenches has a width that varies with a depth, and the at least three vertical trenches are periodically arranged.

20. The 3D NAND memory structure of claim 1, wherein the one or more vertical trenches have a first depth, and the plurality of pillars have a second depth that is greater than the first depth.

* * * * *